(12) United States Patent  
Hosoya et al.

(10) Patent No.: US 7,733,186 B2
(45) Date of Patent: Jun. 8, 2010

(54) BIAS CIRCUIT AND AMPLIFIER USING THE SAME

(75) Inventors: Masahiro Hosoya, Kawasaki (JP); Rui Ito, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/404,520

(22) Filed: Mar. 16, 2009

(65) Prior Publication Data

US 2009/0302949 A1    Dec. 10, 2009

(30) Foreign Application Priority Data

Jun. 4, 2008    (JP)    ............................. 2008-146989

(51) Int. Cl.
*H03F 3/04* (2006.01)
(52) U.S. Cl. ...................... 330/296; 330/289
(58) Field of Classification Search ................. 330/296, 330/285, 261, 289
See application file for complete search history.

(56) References Cited

U.S. PATENT DOCUMENTS

| | | | | |
|---|---|---|---|---|
| 6,066,987 A | * | 5/2000 | Lorenz | ........................ 330/311 |
| 6,809,593 B1 | * | 10/2004 | Newman et al. | ............. 330/285 |
| 7,515,000 B1 | * | 4/2009 | Jin et al. | ...................... 330/279 |
| 7,576,612 B2 | * | 8/2009 | Nakamura et al. | ........... 330/296 |
| 7,629,851 B2 | * | 12/2009 | Tsurumaki et al. | ........... 330/285 |

FOREIGN PATENT DOCUMENTS

JP    2007-336224    12/2007

* cited by examiner

*Primary Examiner*—Henry K Choe
(74) *Attorney, Agent, or Firm*—Turocy & Watson, LLP (57) ABSTRACT

A bias circuit including: a first current source which generates a first current; a second current source which generates a second current having a temperature-to-output current characteristic that an output current characteristic increases or decreases with a change in temperature to intersect with that of the first current; a first current-voltage conversion circuit which converts the first current to a first voltage; a second current-voltage conversion circuit which has an input terminal and converts a current inputted into the input terminal to a second voltage; a comparison circuit which compares the first voltage and the second voltage and generates a third current according to a result of the comparison; an addition unit which adds the third current to the second current and inputs a resulting current to the input terminal; and a voltage-current conversion circuit which converts the second voltage to a fourth current for bias.

13 Claims, 6 Drawing Sheets

BIAS CIRCUIT AND AMPLIFIER USING THE SAME

CROSS-REFERENCE TO RELATED APPLICATIONS

This application is based upon and claims the benefit of priority from the prior Japanese Patent Application No. 2008-146989, filed on Jun. 4, 2008; the entire contents of which are incorporated herein by reference.

BACKGROUND OF THE INVENTION

1. Field of the Invention

The present invention relates, for example, to a bias circuit and an amplifier using the same.

2. Description of the Related Art

Conventionally, a technique disclosed as one of techniques to generate a bias current for use in an amplifier circuit uses a bias circuit having a positive temperature characteristic, a bias circuit having a negative temperature characteristic, and a switch which detects the temperature of the amplifier circuit and switches between the two bias circuits according to the detected temperature.

In the case of this technique, the temperature of the amplifier circuit is detected, and the two bias circuits are switched over by the switch according to the detected temperature, whereby the distortion at low temperatures can be suppressed and the decrease in gain of the amplifier circuit at high temperatures can be suppressed (see, for example, JP-A 2007-336224 (KOKAI)).

BRIEF SUMMERY OF THE INVENTION

However, in the above-described conventional technique, since the temperature of the circuit is detected, and either of the currents from the two bias circuits is selected by the switch to flow, some means needs to be provided to detect the temperature, thereby bringing about a problem of an increased circuit size.

Further, since the two bias circuits are switched over by the switch, the current discontinuously changes at a switch point if there is an error between the circuits, thereby bringing about a problem of occurrence of noise due to the switching.

The present invention has been developed to solve such problems, and it is an object to provide a bias circuit which has a simple circuit configuration, causes no noise due to an error of the circuit, and can obtain a current for bias having excellent characteristics with respect to a temperature variation, and an amplifier using the bias circuit.

A bias circuit including: a first current source which generates a first current; a second current source which generates a second current having a temperature-to-output current characteristic that an output current characteristic increases or decreases with a change in temperature to intersect with that of the first current; a first current-voltage conversion circuit which converts the first current generated by the first current source to a first voltage; a second current-voltage conversion circuit which has an input terminal and converts a current inputted into the input terminal to a second voltage; a comparison circuit which compares the first voltage and the second voltage and generates a third current according to a result of the comparison; an addition unit which adds the third current to the second current and inputs a resulting current to the input terminal of the second current-voltage conversion circuit; and a voltage-current conversion circuit which converts the second voltage converted by the second current-voltage conversion circuit to a fourth current for bias.

A bias circuit according to an aspect of the present invention includes: a first current source which generates and outputs a first current; a second current source which generates and outputs a second current having a temperature-to-output current characteristic that a value of an output current increases or decreases with a change in temperature as compared to that of the first current; a first field effect transistor which converts the first current inputted from the first current source into a drain terminal thereof to a first voltage, and outputs the first voltage; a second field effect transistor which converts the second current inputted from the second current source into a drain terminal thereof to a second voltage, and outputs the second voltage; a differential amplifier which has a positive input terminal and a negative input terminal, compares the first voltage inputted from the first field effect transistor into the negative input terminal and the second voltage inputted from the second field effect transistor into the positive input terminal, and outputs a third voltage that is a difference according to a result of the comparison; a third field effect transistor which permits a third current to flow from a direct-current power supply according to a value of the third voltage inputted into a gate terminal thereof; a fourth field effect transistor which converts the second voltage inputted from the second field effect transistor into a gate terminal thereof to a current for bias; and a current combining unit which connects an output terminal of the second current source and the drain terminal of the second field effect transistor to combine the second current and the third current and input a resulting current into the drain terminal of the second field effect transistor.

An amplifier according to an aspect of the present invention includes a transistor for signal amplification; and the above-described bias circuit which biases the transistor by the current for bias.

With the above-described configuration, a current for bias having excellent characteristics with respect to a temperature variation can be obtained by a simple circuit configuration and without noise caused by an error of the circuit.

DESCRIPTION OF THE EMBODIMENTS

Hereinafter, an embodiment will be described in detail with reference to the drawings.

First Embodiment

Figure 1:
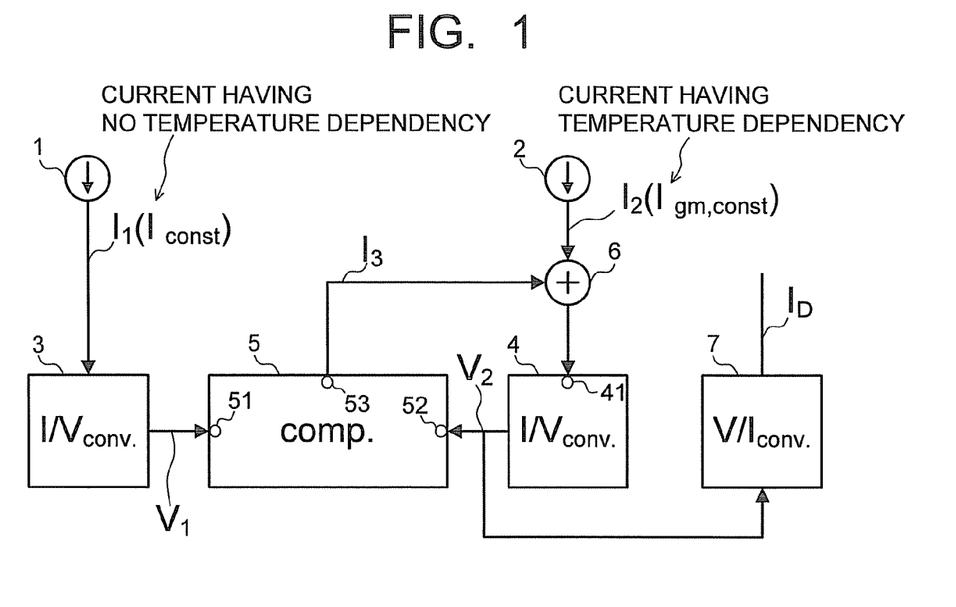
FIG. 1 is a diagram showing a configuration of a bias circuit in one embodiment.

As shown in FIG. 1, this bias circuit has a current source 1 as a first current source, a current source 2 as a second current source having a temperature-to-output current characteristic different from those of the first current source 1, a current-voltage conversion circuit 3 (noted as "I/Vconv. 3" in the drawing) as a first current-voltage conversion circuit, a current-voltage conversion circuit 4 (noted as "I/Vconv. 4" in the drawing) as a second current-voltage conversion circuit, a comparison circuit 5 (noted as "comp. 5" in the drawing), a current addition unit 6 as an addition unit, and a voltage-current conversion circuit 7 (noted as "V/Iconv. 7" in the drawing).

The current source 1 generates a current $I_1$ as a first current whose value changes having a first temperature dependency due to a change in temperature, and outputs it to the current-voltage conversion circuit 3.

More specifically, the first current source 1 has a first output current characteristic with respect to a change in temperature, and generates the current $I_1$. The output current characteristic means a characteristic that the output current changes according to a change in temperature.

The first temperature dependency also includes a temperature-dependent characteristic that the output current does not change due to a variation in temperature.

In this case, the current source 1 does not change in output current due to a variation in temperature, namely, generates a current $I_1$ (I const) having no temperature-dependent characteristic.

Having no temperature-dependency includes here not only that the output characteristic never changes due to a variation in temperature but also that the change in characteristic due to temperature is very small.

In short, it means that the variation amount of the output current with respect to a change in temperature is almost constant.

The current source 2 generates a current $I_2$ as a second current whose value changes having a second temperature dependency due to a change in temperature, and outputs it to the current addition unit 6.

The current source 2 has a second output current characteristic (a temperature-to-output current characteristic) with respect to a change in temperature, which is different from that of the current $I_1$, and generates the current $I_2$.

For example, the current source 2 shall be larger in ratio, at which its output current changes due to a change in temperature, than the current source 1, and generate the current $I_2$ (I gm,const) having temperature dependency as compared to the current source 1.

This means that the current $I_2$ (I gm,const) having temperature dependency changes in output current characteristic due to a variation in temperature more greatly than the current $I_1$.

More specifically, the current source 2 generates the current $I_2$ having a temperature-to-output current characteristic that the output current characteristic increases or decreases with a change in temperature to intersect with that of the current $I_1$.

The current-voltage conversion circuit 3 converts the current $I_1$ (I const) generated by the current source 1 to a voltage $V_1$ as a first voltage, and outputs it.

In other words, the current-voltage conversion circuit 3 generates the voltage $V_1$ according to the current value of the current $I_1$ (I const), and outputs it to the comparison circuit 5.

The current-voltage conversion circuit 4 has an input terminal 41. The current-voltage conversion circuit 4 converts the current inputted from the current addition unit 6 into the input terminal 41 to a voltage $V_2$ as a second voltage, and outputs it to the comparison circuit 5 and the voltage-current conversion circuit 7.

In other words, the current-voltage conversion circuit 4 generates the voltage $V_2$ of a voltage value according to the current value of the current inputted into the input terminal 41, branches the generated voltage $V_2$ into two portions, and outputs them to the comparison circuit 5 and the voltage-current conversion circuit 7, respectively.

The comparison circuit 5 has an input terminal 51, an input terminal 52, and an output terminal 53. Into the input terminal 51, the voltage $V_1$ from the current-voltage conversion circuit 3 is inputted.

Into the input terminal 52, the voltage $V_2$ from the current-voltage conversion circuit 4 is inputted. From the output terminal 53, a current $I_3$ according to the result of comparison between the voltage $V_1$ and the voltage $V_2$ is outputted.

The comparison circuit 5 compares the voltage $V_1$ inputted from the current-voltage conversion circuit 3 into the input terminal 51 and the voltage $V_2$ inputted from the current-voltage conversion circuit 4 into the input terminal 52, generates the current $I_3$ that is a third current according to the comparison result between them, and outputs it from the outputs terminal 53 to the current addition unit 6.

When the voltage $V_2$ converted by the current-voltage conversion circuit 4 is greater than the voltage $V_1$ converted by the current-voltage conversion circuit 3, the comparison circuit 5 does not output any current. Conversely, when the value of the voltage $V_1$ is equal to or greater than that of the voltage $V_2$, the comparison circuit 5 outputs the current $I_3$ which is relational to the voltage value obtained by subtracting the voltage $V_2$ from the voltage $V_1$.

The current addition unit 6 combines the current $I_3$ from the comparison circuit 5 and the current $I_2$ from the current source 2, and outputs the resulting current to the input terminal 41 of the current-voltage conversion circuit 4. More specifically, the current addition unit 6 adds the current $I_3$ to the current $I_2$, and outputs the resulting current to the input terminal 41.

The voltage-current conversion circuit 7 converts the voltage $V_2$ inputted from the current-voltage conversion circuit 4 into a current for output (for supply), and outputs it.

The voltage-current conversion circuit 7 outputs a current n times the current flowing through the current-voltage conversion circuit 4.

The voltage-current conversion circuit 7 outputs a current having a characteristic reversed to those of the current-voltage conversion circuits 3 and 4.

In other words, the voltage-current conversion circuit 7 generates a current of a current value according to the voltage value of the voltage $V_2$, and supplies the current as a bias current to a circuit to be supplied with.

The circuit to be supplied with means an amplifier which is mounted in a communication device such as, for example, a radio receiver or the like.

Figure 2:
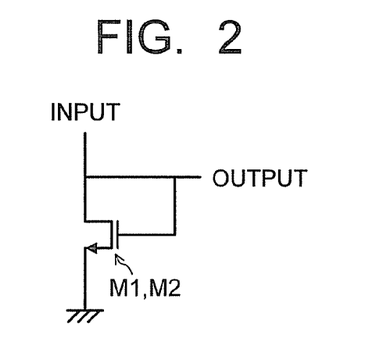
FIG. 2 is a diagram showing an example of a circuit configuration of a current-voltage conversion circuit.

As shown in FIG. 2, at least one of the current-voltage conversion circuit 3 and the current-voltage conversion circuit 4 is realized using a field effect transistor M1, M2 such as, for example, an N-channel MOSFET (hereinafter, referred to as a "nMOSFET").

A source terminal of the field effect transistor M1, M2 is grounded. A gate terminal and a drain terminal of each of the field effect transistors M1 and M2 are short-circuited and connected.

The connection form of the gate terminal and the drain terminal of an FET short-circuited and connected in this way is called diode connection.

In the case of this circuit configuration, current-voltage conversion is performed to multiply an input current by a square root, and the converted voltage is outputted.

Figure 3:
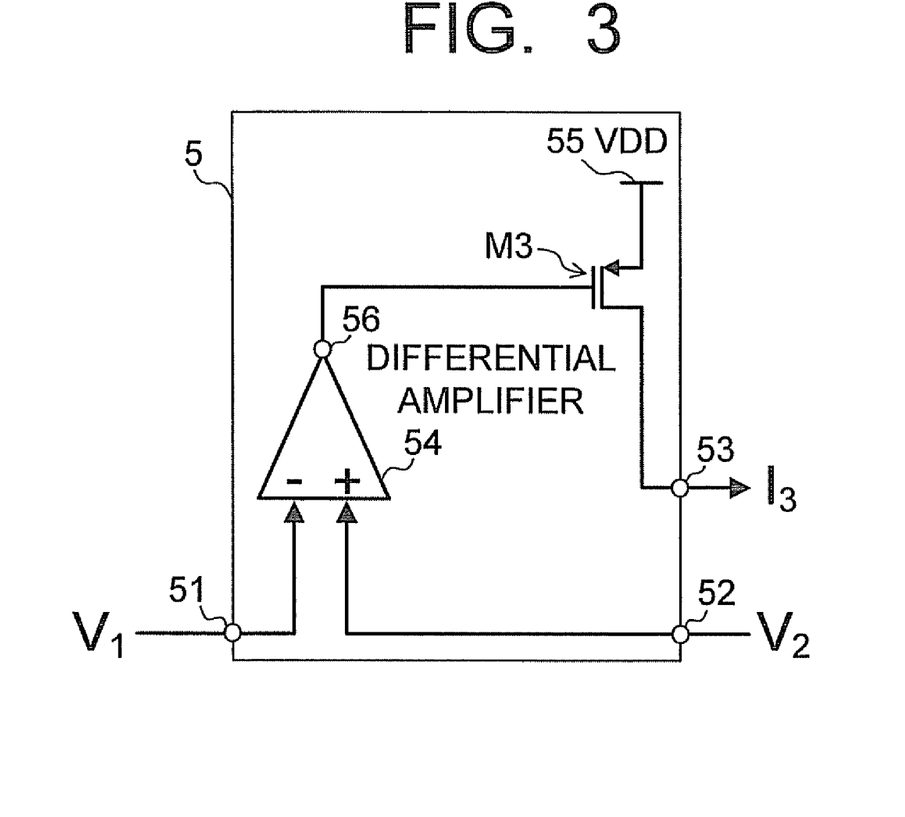
FIG. 3 is a diagram showing an example of a circuit configuration of a comparison circuit.

As shown in FIG. 3, the comparison circuit 5 is composed of a differential amplifier 54, a field effect transistor M3 connected to an output terminal of the differential amplifier 54, and a direct-current power supply VDD 55.

The field effect transistor M3 is, for example, a P-channel MOSFET (hereinafter, referred to as a "pMOSFET").

The field effect transistor M3 functions as a current generation circuit which generates a current $I_3$ as a third current according to a differential voltage value outputted from the differential amplifier 54.

To a source terminal of the field effect transistor M3, the stable direct-current power supply VDD 55 is connected.

The field effect transistor M3 permits the current $I_3$ to flow from the direct-current power supply VDD 55 to the current addition unit 6 according to the value of the voltage inputted to the gate terminal (a gate voltage) from the differential amplifier 54.

The differential amplifier 54 is provided with two input terminals 51 and 52 and one output terminal 56.

The differential amplifier 54 compares voltages inputted to the two input terminals 51 and 52, and inputs a voltage corresponding to the difference between the two voltages from the output terminal 56 into the gate terminal of the field effect transistor M3.

When the relationship between the inputted voltages $V_1$ and $V_2$ compared by the differential amplifier 54 is such that, for example, the voltage $V_2$ is higher in voltage value than the voltage $V_1$ (voltage $V_1$<voltage $V_2$), the differential amplifier 54 outputs a voltage close to the voltage at the direct-current power supply VDD 55 to the gate terminal of the field effect transistor M3, so that the field effect transistor M3 is cut off.

Therefore, the current $I_3$ is not outputted from the field effect transistor M3 when the voltage $V_2$ is higher in voltage value than the voltage $V_1$.

Conversely, when the voltage value of the voltage $V_2$ is decreased, for example, to be equal to or lower than the voltage value of the voltage $V_1$ (voltage $V_1 \geq$ voltage $V_2$), the voltage inputted from the differential amplifier 54 into the gate terminal is low as compared to the voltage value of the direct-current power supply VDD 55, so that the field effect transistor M3 is turned on to output the current $I_3$ from the source terminal of the field effect transistor M3.

Figure 4:
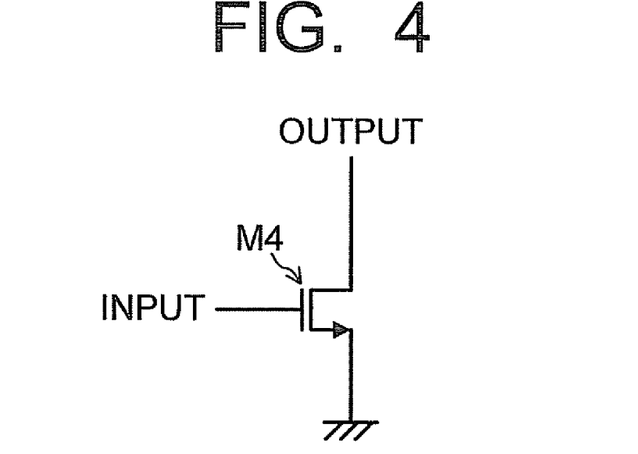
FIG. 4 is a diagram showing an example of a circuit configuration of a voltage-current conversion circuit.

As shown in FIG. 4, the voltage-current conversion circuit 7 is realized using a field effect transistor M4 such as, for example, an nMOSFET.

The field effect transistor M4 controls the amount of current drawn into the drain terminal (or the amount of current to be outputted) according to the value of the voltage $V_2$ inputted into the gate terminal.

In sort, the field effect transistor M4 converts the inputted voltage $V_2$ into a current $I_D$ as a fourth current for bias.

In the voltage-current conversion circuit 7, the current $I_D$ that is n times the current flowing through the current-voltage conversion circuit 4 can be extracted from the voltage-current conversion circuit 7 by setting the ratio between the channel width and the channel length of the field effect transistor M4 to be n times the ratio between the channel width and the channel length of the field effect transistor M2 of the current-voltage conversion circuit 4.

Figure 5:
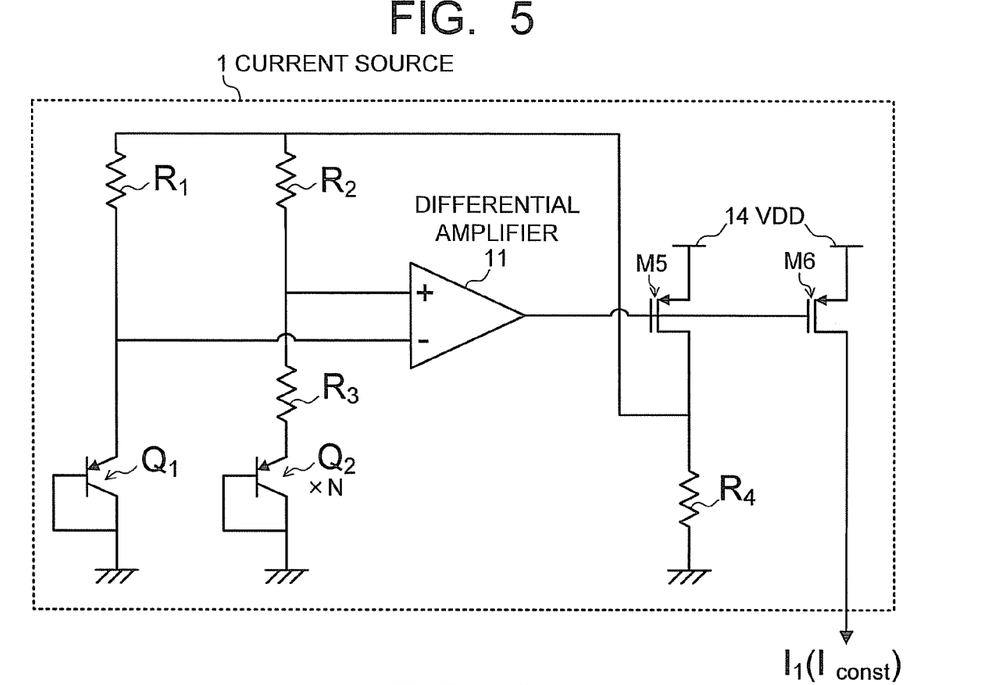
FIG. 5 is a diagram showing an example of a circuit configuration of a first current source.

As shown in FIG. 5, the current source 1 is realized using transistors Q1 and Q2 of the bipolar type which are different in emitter area (hereinafter, referred to as "bipolar transistors Q1 and Q2"), resistors R1, R2, R3, and R4, a differential amplifier 11, field effect transistors M5 and M6, a direct-current power supply 14 and so on. The field effect transistors M5 and M6 are, for example, pMOSFETs.

To an emitter terminal of the bipolar transistor Q1, one end of the resistor R1 and a negative input terminal of the differential amplifier 11 are connected.

A collector terminal and a base terminal of the bipolar transistor Q1 are grounded.

To an emitter terminal of the bipolar transistor Q2, a positive input terminal of the differential amplifier 11 and one end of the resistor Q2 are connected via the resistor R3.

A collector terminal and a base terminal of the bipolar transistor Q2 are grounded.

The other ends of the resistor R1 and the resistor R2 are connected to a drain terminal of the field effect transistor M5.

The output terminal of the differential amplifier 11 is connected to a gate terminal of the field effect transistor M5 and a gate terminal of the field effect transistor M6.

A drain terminal of the field effect transistor M5 is grounded via the resistor R4.

A source terminal of each of the filed effect transistors M5 and M6 is connected to the direct-current power supply VDD 14.

A drain terminal of the field effect transistor M6 is an output terminal.

From this output terminal, the current $I_1$ (I const) having no temperature dependency is outputted.

In the case of the current source 1, the two bipolar transistors Q1 and Q2 are used to generate a constant voltage at one end of the resistor R4.

This causes the constant current to flow through the resistor R4 via the field effect transistor M5 from the direct-current power supply 14, so that the constant current $I_1$ (I const) that is the same as through the field effect transistor M5 also flows through the field effect transistor M6 to which the same voltage as that at the gate terminal of the field effect transistor M5 is applied at the gate terminal thereof.

In short, the current source 1 extracts a bandgap voltage of a semiconductor, generates a current proportional to the bandgap voltage, and outputs the current.

Figure 6:
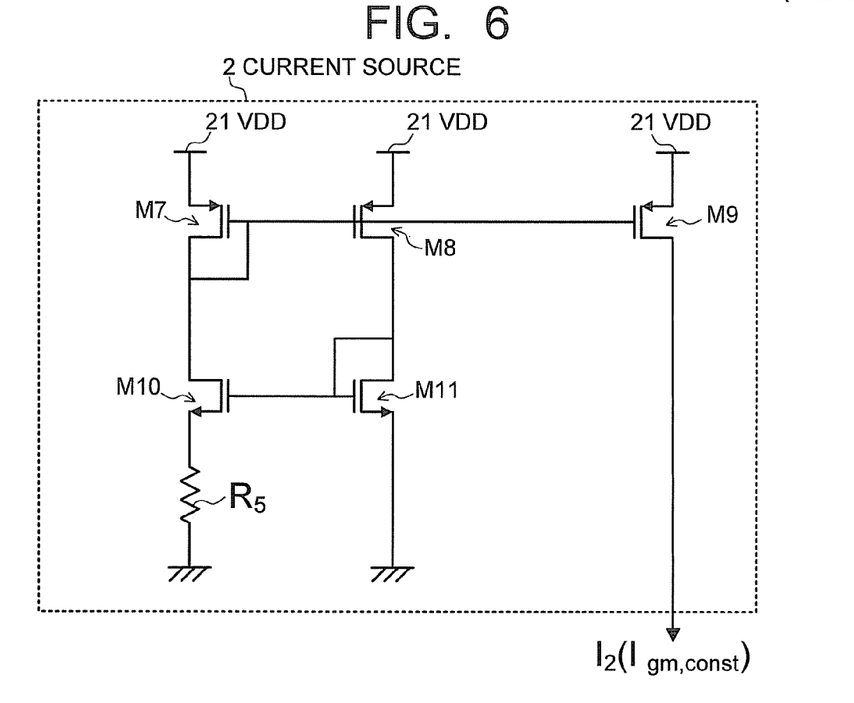
FIG. 6 is a diagram showing an example of a circuit configuration of a second current source.

As shown in FIG. 6, the current source 2 is realized using field effect transistors M7, M8, M9, M10, and M11. The field effect transistors M7, M8, and M9 are, for example, pMOSFETs.

The field effect transistors M10 and M11 are, for example, nMOSFETs.

A source terminal of each of the field effect transistors M7, M8 and M9 is connected to a direct-current power supply VDD 21.

A gate terminal and a drain terminal of the field effect transistor M7 are short-circuited. The gate terminal M7 is connected to gate terminals of the field effect transistor M8 and the field effect transistor M9.

A drain terminal of the field effect transistor M7 is connected to a drain terminal of the field effect transistor M10. A source terminal of the field effect transistor M10 is connected one end of a resistor R5, and the other end of the resistor R5 is grounded.

A gate terminal of the filed effect transistor M10 is connected to a gate terminal of the field effect transistor M11.

A gate terminal and a drain terminal of the field effect transistor M11 are short-circuited and connected.

A source terminal of the field effect transistor M11 is grounded.

The drain terminal of the field effect transistor M11 is connected to the drain terminal of the field effect transistor M8.

The drain terminal of the field effect transistor M9 is an output terminal. From this output terminal, the current $I_2$ (I gm,const) having temperature dependency is outputted.

Feedback is applied such that the transconductance gm of the field effect transistor M11 is a reciprocal ($1/R_5$) of the value of the resistor $R_5$ where the ratio of the channel length and the channel width of the field effect transistor M10 is four times that of the field effect transistor M11.

If the value of the transconductance gm of the field effect transistor M11 tries to change due to temperature, the current increases or decreases by the amount of change, with the result that the value of the transconductance gm of the field effect transistor M11 is constant at the value of the reciprocal of the value of the resistor $R_5$.

More specifically, the current source 2 outputs a current which keeps the transconductance gm of the field effect transistor M11 constant with respect to a variation in temperature. Though the value of the current changes due to temperature, the value of the transconductance which influences the gain of the amplifier gm becomes constant.

From the field effect transistors M7, M8, and M9, the current flows which keeps the transconductance gm constant irrespective of temperature, so that the current is outputted which keeps the transconductance gm of the field effect transistors M7, M8, and M9 constant.

Also the characteristic of the field effect transistor similarly changes with respect to a change in temperature, so that the current $I_2$ (I gm,const) having temperature dependency is outputted.

This allows the gain and band width of the amplifier or the like using this bias circuit to be kept at a certain value or higher irrespective of temperature.

Figure 7:
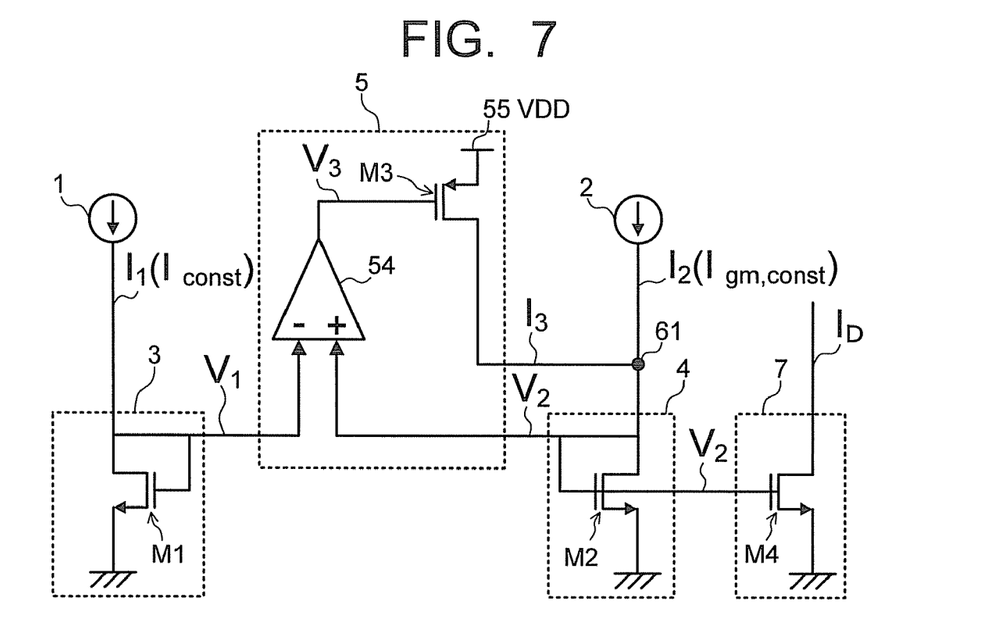
FIG. 7 is a diagram showing an example when the bias circuit in FIG. 1 is composed of circuit elements.

The bias circuit shown in FIG. 1 is a functional block, and a block in which concrete circuits and elements replace the functional block is shown in FIG. 7.

As shown in FIG. 7, the bias circuit in this case is composed of a current source 1, a field effect transistor M1, a differential amplifier 54, a direct-current power supply VDD 55, a current combining unit 61, a field effect transistor M3, a current source 2, a field effect transistor M2, and a field effect transistor M4. The current source 1 and the current source 2 are as those shown in FIG. 5 and FIG. 6, respectively.

The current source 1 generates a current $I_1$ whose value changes having a first temperature dependency due to a change in temperature, and outputs it from its output terminal to a drain terminal of the field effect transistor M1.

The current source 1 is configured as shown in FIG. 5, and thereby generates the current $I_1$ (I const) having no temperature dependency.

The field effect transistor M1 is, for example, an nMOSFET, converts the current $I_1$ (I const) inputted into the drain terminal to a voltage $V_1$, and outputs it to a negative input terminal of the differential amplifier 54.

The differential amplifier 54 has a positive input terminal, a negative input terminal, and an output terminal.

The differential amplifier 54 compares the voltage $V_1$ inputted into the negative input terminal to a voltage $V_2$ inputted into the positive input terminal, and outputs a differential voltage $V_3$ corresponding to the comparison result from the output terminal to a gate terminal of the field effect transistor M3.

The direct-current power supply VDD 55 is a stable direct-source.

The field effect transistor M3 is, for example, a pMOSFET, and permits the current $I_3$ to flow from the direct-current power supply VDD 55 according to the value of the voltage $V_3$ (the gate voltage) inputted into the gate terminal.

In short, the field effect transistor M3 converts the voltage $V_3$ to a current $I_3$ according to the value of the voltage $V_3$, and outputs the current $I_3$.

The current source 2 generates a current $I_2$ having a temperature-to-output current characteristic that the output current characteristic increases or decreases with a change in temperature to intersect with that of the current $I_1$, and outputs the current $I_2$ from the output terminal to the drain terminal of the field effect transistor M2.

The current source 2 is configured as shown in FIG. 6, and thereby generates the current $I_2$ (I gm,const) having temperature dependency.

The field effect transistor M2 is, for example, an nMOSFET, converts the current (the current $I_3$+the current $I_2$) inputted into the drain terminal to a voltage $V_2$, and outputs it to a positive input terminal of the differential amplifier 54.

The field effect transistor M4 is, for example, an nMOSFET, and converts the voltage $V_2$ inputted into the gate terminal to an output current.

The field effect transistor M4 draws the current $I_D$ from a device to be connected, for example, the amplifier, according to the voltage $V_2$ inputted into the gate terminal.

In short, the field effect transistor M4 operates to draw the current from the amplifier according to the voltage $V_2$ inputted from the field effect transistor M2 into the gate terminal.

Note that it is also possible to configure the circuit such that the current $I_D$ is outputted to the amplifier depending on the way to construct the circuit.

The current combining unit 61 is a connection point between the output terminal of the current source 2 and the drain terminal of the field effect transistor M3, that is, a combining unit where circuits are connected to each other, and combines the current $I_3$ and the current $I_2$ and inputs the resulting current into the drain terminal of the field effect transistor M2.

The operation of the bias circuit shown in FIG. 1 will be described below. In this bias circuit, the current $I_1$ (I const) having no temperature dependency is converted to the voltage $V_1$ by the current-voltage conversion circuit 3 and inputted into the input terminal 51 of the comparison circuit 5.

In addition, the current $I_2$ (I gm,const) having temperature dependency is converted to the voltage $V_2$ by the current-voltage conversion circuit 4 and inputted into the input terminal 52 of the comparison circuit 5.

The current-voltage conversion circuit 3 can be a circuit which outputs a voltage that simply increases or decreases with respect to the input current.

To make the description easy to understand, the current-voltage conversion circuit 3 will be described to output a voltage which simply increases with respect to the input current.

The comparison circuit 5 generates the current $I_3$ shown by Expression (1) shown below and outputs it.

$$I_3 = \begin{cases} 0 & (V_1 < V_2) \\ G_{m,comp} \times (V_1 - V_2) & (V_1 \geq V_2) \end{cases} \quad \text{Expression (1)}$$

Incidentally, the direction outward from the comparison circuit 5 of the current $I_3$ is positive, and the transconductance Gm,comp is positive.

The difference in operation due to the magnitude relation between the two voltages (the voltage $V_1$ and the voltage $V_2$) inputted into the comparison circuit 5 will be described here.

The relation between the voltage $V_1$ and the voltage $V_2$ has two cases, that is, the case of the voltage $V_1 <$ the voltage $V_2$ and the case of the voltage $V_1 \geq$ the voltage $V_2$, and therefore the operations for the respective cases will be described.

First, the case of the voltage $V_1 <$ the voltage $V_2$ will be described.

In this case, the comparison circuit 5 outputs no current, so that the first current $I_1$ having no temperature dependency or the current $I_2$ having temperature dependency flows through the current-voltage conversion circuit 3 and the current-voltage conversion circuit 4, respectively.

In this event, the current $I_D$ outputted from the voltage-current conversion circuit 7 is n times the current $I_2$ (I gm,const) having temperature dependency.

Next, the case of the voltage $V_1 \geq$ the voltage $V_2$ will be described.

In this case, the comparison circuit 5 outputs a current of $G_{m,comp} \times (V_1 - V_2)$ as shown in Expression (1).

The comparison circuit 5, the current-addition unit 6, and the current-voltage conversion circuit 4 constitute a negative feedback amplifier here.

It will be described that the current $I_2$ (gm,const) flowing through the current-voltage conversion circuit 4 becomes equal to the current $I_1$ (I const) having no temperature dependency by the negative feedback amplifier.

Assuming that the current-voltage conversion circuit 3 and the current-voltage conversion circuit 4 have equivalent characteristics, the input/output characteristics of the circuits are expressed by $$V_{out} = R \times I_{in} \quad \text{Expression (2)}$$

Incidentally, R is the resistance value and a positive value. Then, the input voltages into the comparison circuit 5 are, respectively, $$V_1 = R \times I_{const} \quad \text{Expression (3)}$$

$$V_2 = R \times (I_{gm,const}) + I_3) \quad \text{Expression (4)}$$

Focusing on that voltage $V_1 \geq$ the voltage $V_2$, when Expression (3) and Expression (4) are substituted into Expression (1), $$I_3 = G_{m,comp} \{ R \times I_{const} - R(I_{gm,const} + I_3) \} \quad \text{Expression (5)}$$

$$= \frac{I_{const} - I_{gm,const}}{1 + 1/(G_{m,comp} R)} \quad \text{Expression (6)}$$

$$\simeq I_{const} - I_{gm,const} \quad (\because G_{m,comp} R \gg 1) \quad \text{Expression (7)}$$

are obtained.

Namely, when designed to establish Gm,comp R>>1, the comparison circuit 5 outputs the difference between two currents under that the voltage $V_1 \geq$ the voltage $V_2$.

Namely, the first current $I_1$ (I const) having no temperature dependency flows through the current-voltage conversion circuit 4.

As a result, a current that is n times the first current $I_1$ (I const) having no temperature dependency flows through the voltage-current conversion circuit 7.

The above operation allows the two current values to be switched without discontinuous point therebetween without switching the circuit by a switch.

Note that when this bias circuit is used for a device such as, for example, an amplifier circuit, a current source shall be used which keeps constant the transconductance gm of a transistor for signal amplification for use in the amplifier circuit, as the current source 2 which generates the $I_2$ (I gm, const) having temperature dependency in order to suppress the decreases in gain and bandwidth at high temperatures.

Figure 8:
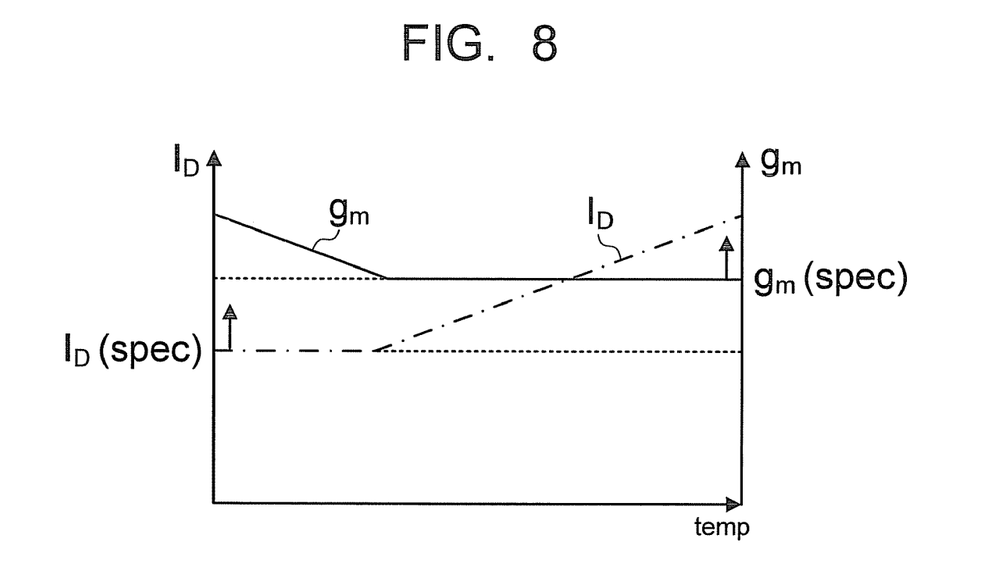
FIG. 8 is a chart showing a temperature-to-output current characteristic of the bias circuit and a temperature-to-transconductance characteristic of an amplifier to be biased.

The relation between the value of the output current $I_D$ of the bias circuit when using such a current source 2 and temperature (the temperature-to-output current characteristic), and the relation between the transconductance of the transistor and temperature (the temperature-to-transconductance gm characteristic) are shown in FIG. 8.

In this drawing, $I_D$ (spec) indicated by a dotted line is a minimum current value (a rated value) of the bias current required for satisfying the rating of the amplifier circuit to be biased, and if the bias current is below this value, the distortion value increases so that the rating of the amplifier is not satisfied.

Similarly, gm(spec) indicated by a dotted line is a rated value of the transconductance gm of the amplifier which shows that when the transconductance gm is equal to or less than this value, the amplifier lowers its performance.

The output current $I_D$ has a characteristic showing a constant value that is the same as $I_D$ (spec) at low temperatures and increasing after the temperature rises to a certain value.

As for the transconductance gm has a characteristic showing a constant value that is the same as gm(spec) at high temperatures and increasing after the temperature decreases to a change point of the output current $I_D$.

In the bias circuit of this embodiment, the output current $I_D$ and the transconductance gm exhibit such a relation, so that the amplifier can be operated at a minimum bias current as well as both specifications of the output current $I_D$ and the transconductance gm can be satisfied.

Namely, in this bias circuit, the larger current of the currents from the two current sources 1 and 2 can be inputted into the current-voltage conversion circuit 4.

Thus, the current $I_1$ (I const) having no temperature dependency is used in order to suppress the degradation in distortion characteristic at low temperatures, while the current $I_2$ (I gm, const) which keeps the transconductance gm constant is used in order to suppress the degradation in frequency characteristic at high temperatures, whereby the current for use in the circuit can be reduced.

When the relation between the voltages inputted into the comparison circuit 5 is such that the voltage $V_1 <$ the voltage $V_2$, the differential amplifier 54 outputs a voltage close to the power supply voltage VDD 55, so that the field effect transistor M3 is cut off.

Therefore, the field effect transistor M3 does not output the current $I_3$ when the voltage $V_1 <$ the voltage $V_2$.

Besides, when the relation between the voltages inputted into the comparison circuit 5 is such that the voltage $V_1 \geq$ the voltage $V_2$, the output voltage from the differential amplifier

54 is lower than the voltage value of the direct-current power supply VDD 55, so that the field effect transistor M3 is turned on and therefore outputs the current $I_3$.

With such an operation, the input/output characteristics indicated by Expression (1) can be realized.

As described above, according to this first embodiment, the current $I_1$ (I const) having no temperature dependency and the current $I_2$ (I gm,const) having temperature dependency are converted to voltages, the voltages are compared to each other, the current $I_3$ according to the comparison result is outputted to the current addition unit 6, and the current $I_3$ and the current $I_2$ (I gm,const) are added together in the current addition unit 6, whereby the currents $I_1$ and $I_2$ from the two current sources 1 and 2 can be smoothly switched over with respect to a change in temperature.

The current source 2 is configured to output the current $I_2$ (I gm,const) which keeps the transconductances gm of the field effect transistors M7, M8 and M9 constant with respect to a variation in temperature, whereby the gain and the bandwidth of the amplifier using the bias circuit can be kept at certain values or higher irrespective of temperature to satisfy the bias current rating $I_D$ (spec) of the amplifier.

The field effect transistors M1 and M2 whose drain terminal terminals and gate terminals are short-circuited and connected (diode connected) are used in the current-voltage conversion circuits 3 and 4, whereby the values of the currents can be converted to values of voltages which are easily compared to each other for judgment.

The comparison circuit 5 is configured not to output the current $I_3$ when the relation between the voltage $V_1$ outputted from the current-voltage conversion circuit 3 and the voltage $V_2$ outputted from the current-voltage conversion circuit 4 is $V_1 < V_2$, but to output a current proportional to $V_1 - V_2$ when $V_1 \geq V_2$, whereby the greater current out of the current $I_1$ (I const) having no temperature dependency and the current $I_2$ (I gm,const) having temperature dependency can be extracted by an increase or decrease in the amount of current (without switching) as the output current of the bias circuit.

Second Embodiment

A second embodiment will be described with reference to FIG. 9.

The second embodiment is an example in which the current source 1 and the current source 2 shown in the above-described first embodiment are replaced with each other, and the same symbols and numbers in the first embodiment are given to the same configurations as those of the first embodiment and description thereof will be omitted.

Figure 9:
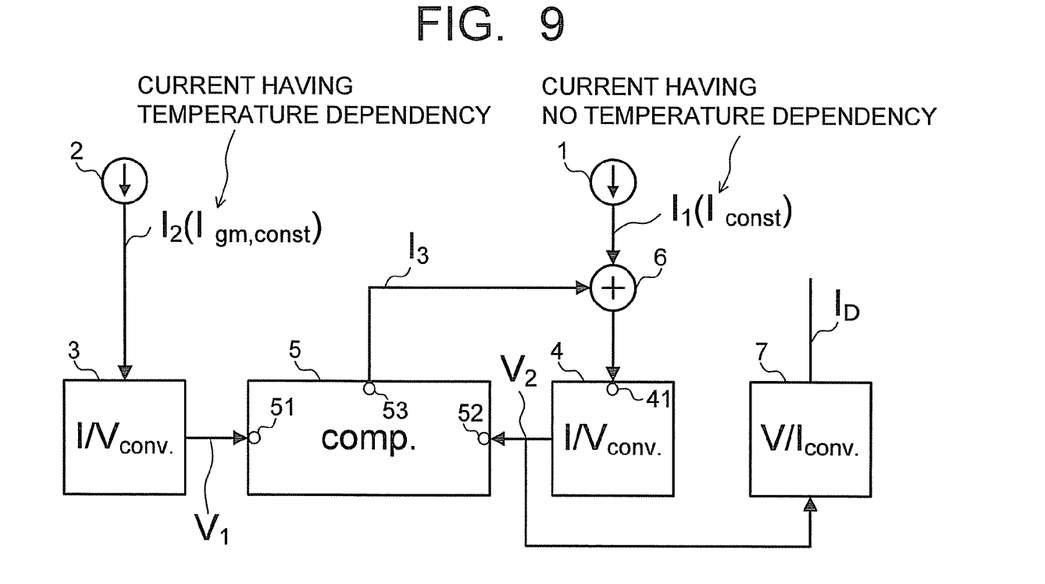
FIG. 9 is a diagram showing a configuration of a second embodiment.

More specifically, the second embodiment is an example in which the current source 1 which generates the current $I_1$ (I const) having no temperature dependency is connected to the current addition unit 6, while the current source 2 which generates the current $I_2$ (gm,const) having temperature dependency is connected to the current-voltage conversion circuit 3 as shown in FIG. 9.

According to the bias circuit of the second embodiment as described above, even when the current source 1 which generates the current $I_1$ (I const) having no temperature dependency is connected to the current addition unit 6, while the current source 2 which generates the current $I_2$ (gm,const) having temperature dependency is connected to the current-voltage conversion circuit 3, the currents $I_1$ and $I_2$ are compared, the current $I_3$ according to the comparison result is outputted to the current addition unit 6, and the current $I_3$ and the current $I_1$ (I const) are added together in the current addition unit 6, whereby the currents $I_1$ and $I_2$ from the two current sources 1 and 2 can be smoothly switched over with respect to a change in temperature.

Third Embodiment

A third embodiment will be described with reference to FIG. 10. This third embodiment is an example in which the above-described bias circuit is applied to an amplifier.

Figure 10:
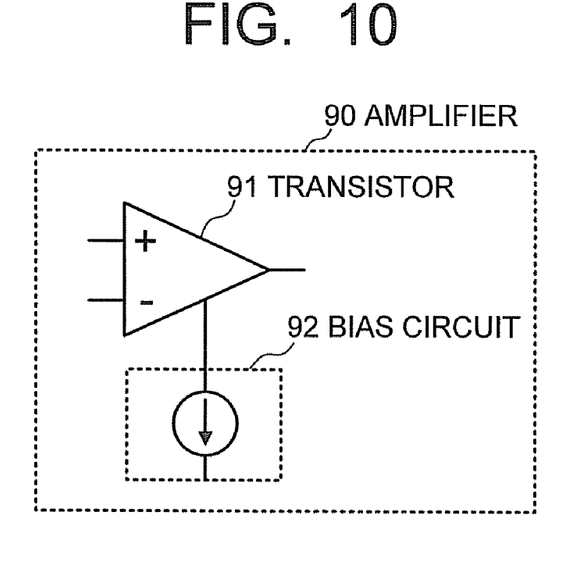
FIG. 10 is a diagram showing a configuration of a third embodiment.

As shown in FIG. 10, an amplifier 90 has a transistor 91 and a bias circuit 92.

The transistor 91 is for signal amplification and biased by a bias current $I_D$ from the bias circuit 92.

For the bias circuit 92, the bias circuit shown in the above-described first and second embodiments is used.

Thus, according to this third embodiment, the bias circuit shown in the above-described first and second embodiments is employed in the amplifier 90, whereby the degradation in distortion characteristic at low temperatures can be suppressed, and the degradation in frequency characteristic at high temperatures can be suppressed, while the power of the amplifier 90 can be saved.

The bias circuit shown in each of the embodiments is applicable in an amplifier circuit which is formed on an integrated circuit, in which the degradation in distortion characteristic at low temperatures and the degradation in frequency characteristic at high temperatures can be suppressed, while the power of the amplifier can be saved.

Fourth Embodiment

A fourth embodiment will be described with reference to FIG. 11. This fourth embodiment is an example in which the amplifier and the bias circuit in the above-described third embodiment are applied to a communication device such as a receiver.

Figure 11:
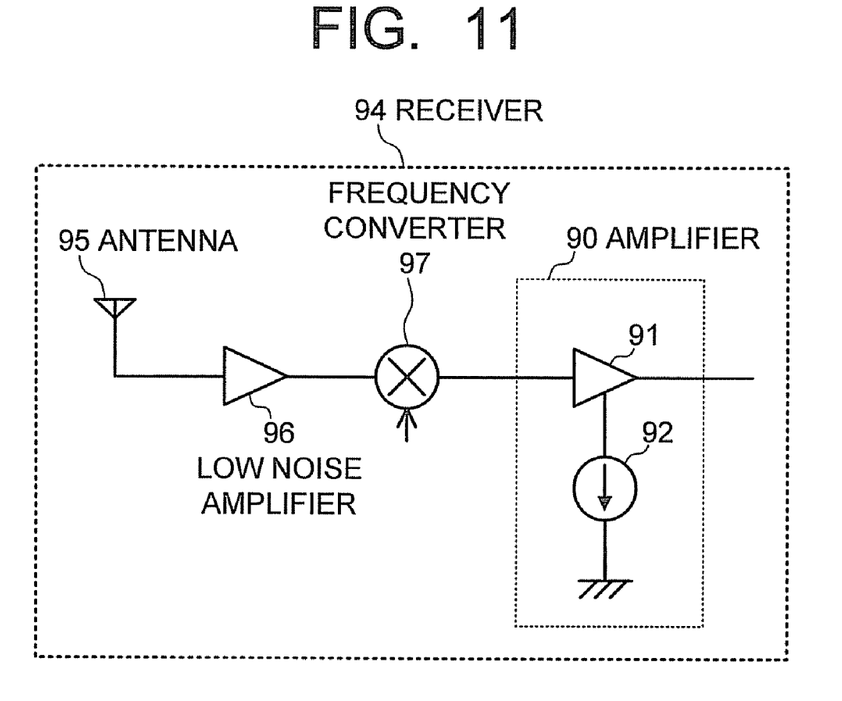
FIG. 11 is a diagram showing a configuration of a fourth embodiment.

As shown in FIG. 11, this receiver 94 has an antenna 95, a low noise amplifier 96, a frequency converter 97, an amplifier 90 and a bias circuit 92.

The antenna 95 receives radio waves. The low noise amplifier 96 amplifies the output RF signal (a high frequency signal) from the antenna 95 and generates an amplified RF signal.

The frequency converter 97 converts the RF signal generated by the low noise amplifier 96 to a signal at a low frequency.

The above described antenna 95, low noise amplifier 96, and frequency converter 97 function as a receiving unit which receives radio waves and outputs the received signal to the amplifier 90.

The amplifier 90 amplifies the signal whose frequency has been converted by the frequency converter 97. Namely, the amplifier 90 amplifies the received signal received by the receiving unit.

The bias circuit 92 supplies a bias current to the amplifier 90.

Forms in which the bias circuit 92 supplies the bias current to the amplifier 90 include a form of a current sink which draws a current from the amplifier 90 and a form of a current source which outputs a current from the bias circuit 92 to the amplifier 90, and the present invention is applicable to both forms.

Thus, according to this fourth embodiment, the amplifier 90 shown in the above-described third embodiment is used for the amplifier 90 to be mounted on the receiver, whereby the degradation in distortion characteristic at low temperatures can be suppressed, and the degradation in frequency characteristic at high temperatures can be suppressed, while the power of the receiver can be saved.

The present invention is applicable for an analogue integrated circuit including wireless communication and wired communication and is effective, in particular, to the saving of power of the integrated circuit including a filter circuit and an amplifier circuit using an operational amplifier.

Other Embodiments

It should be noted that the present invention is not limited only to the above-describe embodiments, but the components may be modified in implementation phase without departing from the spirit of the present invention.

Further, various inventions can be made by combining a plurality of components disclosed in the above-described embodiments as necessary.

For example, some components may be deleted from all of the components shown in the embodiments.

In other words, embodiments of the present invention are not limited to the above-describe embodiments, but can be extended or changed, and the extended and changed embodiments are also included in the technical scope of the present invention.

What is claimed is:

1. A bias circuit, comprising:
a first current source which generates a first current;
a second current source which generates a second current having a temperature-to-output current characteristic that an output current characteristic increases or decreases with a change in temperature to intersect with that of the first current;
a first current-voltage conversion circuit which converts the first current generated by the first current source to a first voltage;
a second current-voltage conversion circuit which has an input terminal and converts a current inputted into the input terminal to a second voltage;
a comparison circuit which compares the first voltage and the second voltage and generates a third current according to a result of the comparison;
an addition unit which adds the third current to the second current and inputs a resulting current to the input terminal of the second current-voltage conversion circuit; and
a voltage-current conversion circuit which converts the second voltage converted by the second current-voltage conversion circuit to a fourth current for bias.

2. The bias circuit according to claim 1,
wherein the first current does not vary in output value with respect to a change in temperature.

3. The bias circuit according to claim 1,
wherein the second current varies in output value with respect to a change in temperature, and is larger in variation amount by which the output value increases or decreases than the first current.

4. The bias circuit according to claim 1,
wherein the second current source outputs the second current to keep a transconductance of a device to be biased constant with respect to a change in temperature.

5. The bias circuit according to claim 1,
wherein at least one of the first current-voltage conversion circuit and the second current-voltage conversion circuit is a filed effect transistor.

6. The bias circuit according to claim 5,
wherein the field effect transistor is an N-channel MOSFET having a drain terminal and a gate terminal short-circuited and connected.

7. The bias circuit according to claim 1,
wherein when the second voltage converted by the second current-voltage conversion circuit is greater than the first voltage converted by the first current-voltage conversion circuit, the comparison circuit does not output the third current, whereas when the first voltage is equal to or greater than the second voltage, the comparison circuit outputs the third current that is proportional to a value obtained by subtracting the second voltage from the first voltage.

8. The bias circuit according to claim 1,
wherein the comparison circuit comprises:
a differential amplifier which compares the first voltage converted by the first current-voltage conversion circuit and the second voltage converted by the second current-voltage conversion circuit, and outputs a differential voltage obtained by subtracting one of the voltages from the other voltage; and
a current generation circuit which generates a third current according to a value of the differential voltage outputted from the differential amplifier.

9. The bias circuit according to claim 8,
wherein the current generation circuit is a P-channel MOSFET having a source terminal connected to a direct-current power supply, and outputs the third current to a drain terminal thereof.

10. The bias circuit according to claim 1,
wherein the voltage-current conversion circuit is a transistor which operates to draw a current from a drain terminal thereof according to the fourth current.

11. The bias circuit according to claim 10,
wherein the transistor is an N-channel MOSFET.

12. A bias circuit, comprising:
a first current source which generates and outputs a first current;
a second current source which generates and outputs a second current having a temperature-to-output current characteristic that an output current characteristic increases or decreases with a change in temperature to intersect with that of the first current;
a first field effect transistor which converts the first current inputted from the first current source into a drain terminal thereof to a first voltage, and outputs the first voltage;
a second field effect transistor which converts the second current inputted from the second current source into a drain terminal thereof to a second voltage, and outputs the second voltage;
a differential amplifier which has a positive input terminal and a negative input terminal, compares the first voltage inputted from the first field effect transistor into the negative input terminal and the second voltage inputted from the second field effect transistor into the positive input terminal, and outputs a third voltage that is a difference according to a result of the comparison;
a third field effect transistor which permits a third current to flow from a direct-current power supply according to a value of the third voltage inputted into a gate terminal thereof;
a fourth field effect transistor which converts the second voltage inputted from the second field effect transistor into a gate terminal thereof to a current for bias; and a current combining unit which connects an output terminal of the second current source and the drain terminal of the second field effect transistor to combine the second current and the third current and input a resulting current into the drain terminal of the second field effect transistor.

13. An amplifier, comprising:
a transistor for signal amplification; and
a bias circuit according to claim 1 which biases the transistor by the fourth current.

* * * * *